US012764871B2

(12) United States Patent
Xu et al.

(10) Patent No.: US 12,764,871 B2
(45) Date of Patent: Oct. 13, 2026

(54) BIO-IMPLANTABLE DEVICE AND FABRICATING METHOD OF THE SAME

(71) Applicants: QingDing Precision Electronics (Huai'an) Co., Ltd., Huai'an (CN); Avary Holding (Shenzhen) Co., Ltd., Shenzhen (CN); Garuda Technology Co., Ltd., New Taipei City (TW)

(72) Inventors: Wan-Ling Xu, Shenzhen (CN); Kuan-Ying Chen, Huai'an (CN)

(73) Assignees: QINGDING PRECISION ELECTRONICS (HUIA'AN) CO., LTD., Huai'an (CN); AVARY HOLDING (SHENZHEN) CO., LTD., Shenzhen (CN); GARUDA TECHNOLOGY CO., LTD., New Taipei City (CN)

( * ) Notice: Subject to any disclaimer, the term of this patent is extended or adjusted under 35 U.S.C. 154(b) by 185 days.

(21) Appl. No.: 18/930,748

(22) Filed: Oct. 29, 2024

(65) Prior Publication Data

US 2026/0122789 A1 Apr. 30, 2026

(51) Int. Cl.
*H05K 3/321* (2026.01)
*H05K 1/185* (2026.01)
(Continued)

(52) U.S. Cl.
CPC ............ *H05K 3/321* (2013.01); *H05K 1/186* (2013.01); *H05K 1/189* (2013.01); *H05K 3/284* (2013.01);
(Continued)

(58) Field of Classification Search
CPC .... H05K 1/189; H05K 1/10283; H05K 1/147; H05K 3/321; H05K 3/284; H05K 3/4611;
(Continued)

(56) References Cited

U.S. PATENT DOCUMENTS 11,968,788 B2 4/2024 Yang et al.
12,004,840 B2 * 6/2024 Maharbiz ............ A61B 5/0031
(Continued)

FOREIGN PATENT DOCUMENTS

CN 113180604 B 8/2022
CN 115775795 A 3/2023
(Continued)

OTHER PUBLICATIONS

Kaur, Gagan et al., "Flexible conductive graphene/polyurethane composite films forbiomedical applications", Frontiers in Bioengineering and Biotechnology, *10th World Biomaterials Congress*, Montréal, Canada, May May 17-22, 2016, event abstract, 2 pages, retrieved on Oct. 29, 2024 < https://internal-www.frontiersin.org/10.3389/conf.FBIOE.2016.01.01877/event_abstract>.

*Primary Examiner* — Thai Pham
(74) *Attorney, Agent, or Firm* — MUNCY, GEISSLER, OLDS & LOWE, P.C.

(57) ABSTRACT

A bio-implantable device and a fabricating method of the same are provided. The bio-implantable device includes a flexible circuit board, a sensor, an elastic conductive layer, an electrode structure, and an elastic insulating layer. The flexible circuit board includes a wiring layer. The sensor is disposed on the wiring layer. The elastic conductive layer covers the sensor. The electrode structure is disposed on the elastic conductive layer and is configured to collect an electric signal from a creature. The electrode structure is electrically connected to the sensor through the elastic conductive layer. The elastic insulating layer covers the flexible circuit board and exposes the electrode structure and the elastic conductive layer.

16 Claims, 7 Drawing Sheets

100A

(51) Int. Cl.
*H05K 1/189* (2026.01)
*H05K 3/28* (2006.01)
*H05K 3/46* (2006.01)
*G06F 3/01* (2006.01)

(52) U.S. Cl.
CPC ............ *H05K 3/4611* (2013.01); *G06F 3/015* (2013.01); *H05K 2201/10098* (2013.01); *H05K 2201/10151* (2013.01)

(58) Field of Classification Search
CPC .......... H05K 2201/10151; G06F 3/015; G06F 3/04164
See application file for complete search history.

(56) References Cited

U.S. PATENT DOCUMENTS

| | | | | |
|---|---|---|---|---|
| 12,274,877 | B2 * | 4/2025 | Carmena | A61N 1/36002 |
| 2008/0041617 | A1 * | 2/2008 | Chen | H05K 1/189 174/260 |
| 2016/0310048 | A1 * | 10/2016 | Pang | A61B 5/14532 |
| 2019/0388013 | A1 * | 12/2019 | Achmann | A61B 5/6848 |
| 2026/0025928 | A1 * | 1/2026 | Tseng | G06F 1/163 |

FOREIGN PATENT DOCUMENTS

| | | | | |
|---|---|---|---|---|
| CN | 115736935 | B | 9/2023 | |
| CN | 117563128 | A | 2/2024 | |
| CN | 118177814 | A | 6/2024 | |
| CN | 118215204 | A | 6/2024 | |
| TW | I768601 | B | 6/2022 | |
| TW | I807407 | B | 7/2023 | |
| WO | WO-2011155946 | A1 * | 12/2011 | H10W 70/688 |
| WO | WO2024/097404 | A1 | 5/2024 | |

* cited by examiner

100A

BIO-IMPLANTABLE DEVICE AND FABRICATING METHOD OF THE SAME

BACKGROUND

Field of Invention

The present application relates to a bio-implantable device and a fabricating method of the same.

Description of Related Art

The brain computer interface (BCI) is used to establish connections between a brain of a creature (e.g., human or animal) and an external device, thereby allowing information to be transferred between the brain and the external device. The brain computer interface can be divided into invasive brain computer interface, partially invasive brain computer interface, and non-invasive brain computer interface. For example, the invasive brain computer interface can pass through the braincase and be implanted in the cerebral cortex in the cranial cavity, and the electrode directly contacts the cerebral cortex to acquire brain signals, and the invasive brain computer interface transmits the brain signals to the external device. The partially invasive brain computer interface can be implanted in the cranial cavity but does not reach the cerebral cortex. The non-invasive brain computer interface does not need to be implanted in the creature's body and acquires the brain signals through contact between the electrode and the outside of the brain (e.g., skin surface).

In general, the invasive brain computer interface can obtain better quality brain signals. However, the elements of the current invasive brain computer interface are increased with multiple functions, so that the volume of the invasive brain computer interface is larger, which not only increases the signal transmission paths to affect the signal integrity, but also easily causes the implanted person to feel uncomfortable.

SUMMARY

At least one embodiment of the application provides a bio-implantable device and a fabricating method of the same, in which the bio-implantable device shortens a signal transmission path to improve signal integrity by minimizing a distance between an electrode and a sensor.

The bio-implantable device provided by the at least one embodiment of the application includes a flexible circuit board, a sensor, an elastic conductive layer, an electrode structure, and an elastic insulating layer. The flexible circuit board includes a wiring layer. The sensor is disposed on the wiring layer. The elastic conductive layer covers the sensor. The electrode structure is disposed on the elastic conductive layer and is configured to collect an electric signal from a creature. The electrode structure is electrically connected to the sensor through the elastic conductive layer. The elastic insulating layer covers the flexible circuit board and exposes the electrode structure and the elastic conductive layer.

The fabricating method of the bio-implantable device provided by the at least one embodiment of the application includes: providing a flexible circuit board, in which the flexible circuit board includes a wiring layer; disposing a sensor on the wiring layer; forming an elastic conductive layer to cover the sensor after disposing the sensor; forming an elastic insulating layer to cover the flexible circuit board and to expose the elastic conductive layer after forming the elastic conductive layer; and disposing an electrode structure on the elastic conductive layer after forming the elastic conductive layer, in which the electrode structure is electrically connected to the sensor through the elastic conductive layer.

Based on the above, in the bio-implantable device applied for above embodiments, the electrode structure is directly electrically connected to the sensor through the elastic conductive layer, thereby shortening a signal transmission path to improve signal integrity.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
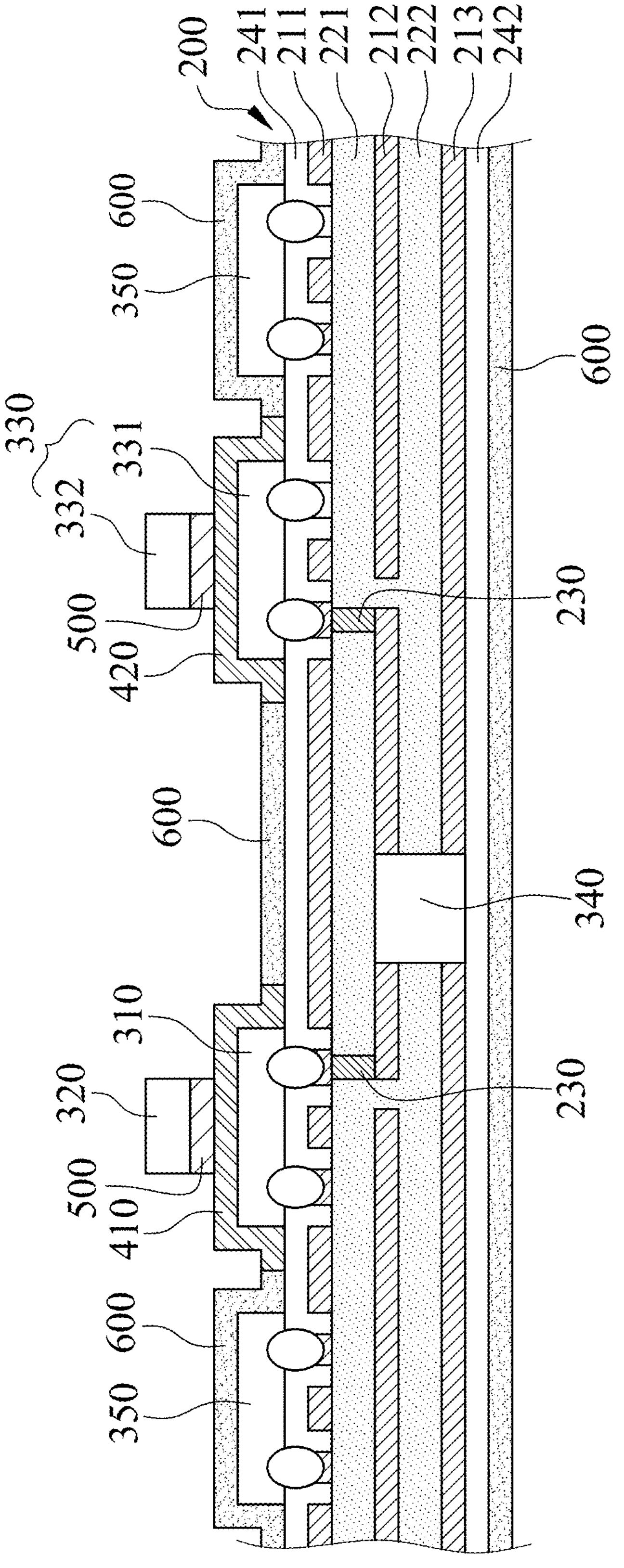
FIG. 1 is a partial cross-sectional diagram of a bio-implantable device according to at least one embodiment of the application.

Reference will now be made in detail to the present embodiments of the invention, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, baseboards, and areas) in the drawings will be enlarged in unusual proportions, and the quantity of some elements will be reduced. Accordingly, the description and explanation of the following embodiments are not limited to the quantities, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties. In addition, in order to clearly illustrate following examples, the components with the same or similar features are denoted by the same reference characters.

FIG. 1 is a partial cross-sectional diagram of a bio-implantable device 100A according to at least one embodiment of the application. Referring to FIG. 1, the bio-implantable device 100A is capable of applying to capture creature's brain signals such as human's brain signals, where the bio-implantable device 100A is for example an invasive brain computer interface, but is not limited thereto. The bio-implantable device 100A is also capable of applying to capture other electrical signals related to the creature such as a visual prosthesis, or a cochlear implant. The bio-implantable device 100A includes a flexible circuit board 200, a sensor 310, an electrode structure 320, a transceiver 330, a processor 340, elastic conductive layers 410, 420, multiple conductive adhesive layers 500, and an elastic insulating layer 600.

The flexible circuit board 200 includes at least two wiring layers (e.g., wiring layers 211~213), multiple dielectric layers 221, 222, multiple conductive structures 230, and multiple covering layers 241 and 242. In the example of FIG. 1, the flexible circuit board 200 includes three wiring layers 211~213, two dielectric layers 221, 222, and two covering layers 241, 242, but is not limited thereto. The wiring layers 211~213 and the dielectric layers 221, 222 are in stacks. The dielectric layer 221 is sandwiched between the adjacent wiring layers 211 and 212. The dielectric layer 222 is sandwiched between the adjacent wiring layers 212 and 213.

The conductive structures 230 contact the wiring layer 211 and extend through the dielectric layer 221 to contact the wiring layer 212. The conductive structures 230 are electrically connected to the wiring layers 211 and 212. The conductive structures 230 may be blind via holes. The covering layers 241 and 242 are respectively located on top and bottom two sides of the flexible circuit board 200, where the covering layers 241 and 242 respectively cover the wiring layers 211 and 213, and the wiring layers 211 and 213 are located between the covering layers 241 and 242. In the example of FIG. 1, the covering layer 241 exposes element pads (not shown) of the wiring layer 211.

The materials of the wiring layers 211~213 may be copper. The materials of the dielectric layers 221 and 222 may be polyimide (PI), modified polyimide (MPI), liquid crystal polymer (LCP), or polytetrafluoroethylene (PTFE). The materials of covering layers 241 and 242 may be polyimide.

The sensor 310 may be disposed on the wiring layer 211 exposed by the covering layer 241. The electrode structure 320 is disposed on the flexible circuit board 200 and is located over the sensor 310. The transceiver 330 is disposed on the flexible circuit board 200 and includes a radio frequency element 331 and an antenna 332. The radio frequency element 331 may be disposed on the wiring layer 211 exposed by the covering layer 241. The antenna 332 is disposed on the flexible circuit board 200 and is located over the radio frequency element 331.

The processor 340 may be disposed inside the flexible circuit board 200. In the example of FIG. 1, the processor 340 is disposed between the wiring layers 212 and 213, and is electrically connected to the sensor 310 and the radio frequency element 331 of the transceiver 330 through the conductive structures 230. The materials of the electrode structure 320 may be conductive materials and biocompatible materials, such as gold, platinum, or titanium.

The elastic conductive layer 410 covers the sensor 310, and is disposed between the electrode structure 320 and the sensor 310. The electrode structure 320 is electrically connected to the sensor 310 through the elastic conductive layer 410. The elastic conductive layer 420 covers the radio frequency element 331 and is disposed between the antenna 332 and the radio frequency element 331. The antenna 332 is electrically connected to the radio frequency element 331 through the elastic conductive layer 420.

Furthermore, the material of the elastic conductive layer 410 or 420 includes electroactive polymer or conductive polymer. The electroactive polymer is a composite material that includes conductive particles and a polymer with conjugated structures. The polymer may be polyimide, epoxy, polyurethane (PU), poly (methyl methacrylate) (PMMA), polyvinyl chloride (PVC) or polyethylene terephthalate. In particular, the elastic conductive layers 410 and 420 have both conductivity and elasticity.

For example, the polymer of the elastic conductive layer 410 or 420 may be the polyurethane with the conjugated structures of siloxane. In other words, polyurethane can be modified with siloxane. The conductive particles can be grapheme. The conductivity of the elastic conductive layer 410 or 420 is promoted with increasing weight percent concentration in conductivity tests. The elastic conductive layer 410 or 420 has a certain tensile strength in mechanical tests. In addition, the elastic conductive layer 410 or 420 is not toxic to living cells and has good biocompatibility in vitro cell viability assay tests.

It is worth mentioning that the elastic conductive layer 410 covers the upper surface and sides of the sensor 310 to wrap the sensor 310, and the elastic conductive layer 420 covers the upper surface and sides of the radio frequency element 331 to wrap the radio frequency element 331. In this way, the sensor 310 and the radio frequency element 331 will not be able to make direct contact with the creature's body. When in contact with the creature's body, the elastic conductive layers 410 and 420 have good biocompatibility to prevent adverse effects on the creature. The elastic conductive layer 410 also increases access areas between the electrode structure 320 and the creature's body, and the elastic conductive layer 410 may assist in collecting the electric signals.

Multiple conductive adhesive layers 500 are disposed between the electrode structure 320 and the elastic conductive layer 410, and between the antenna 332 and the elastic conductive layer 420, so that the electrode structure 320 and the elastic conductive layer 410 are bonded and electrically conductive, and the antenna 332 and the elastic conductive layer 420 are bonded and electrically conductive. For example, the conductive adhesive layers 500 may be disposed between the contact points of the electrode structure 320 and the elastic conductive layer 410, or between the input and output ports of the antenna and the elastic conductive layer 420. The conductive adhesive layers 500 may be electrically conductive adhesives.

The elastic insulating layer 600 covers the flexible circuit board 200 and exposes the electrode structure 320 and the elastic conductive layer 410. In addition, the elastic insulating layer 600 also exposes the antenna 332 and the elastic conductive layer 420. The elastic insulating layer 600 may cover the surfaces and sides of the flexible circuit board 200. Specifically, the elastic insulating layer 600 covers the entire flexible circuit board 200, but only exposes the electrode structure 320, the antenna 332, and the elastic conductive layers 410 and 420. The thickness of the elastic insulating layer 600 is identical to that of the elastic conductive layer 410 or 420. That is, the surface of the elastic insulating layer 600 is flush with that of the elastic conductive layer 410 or 420 at the junction of the elastic insulating layer 600 and the elastic conductive layer 410 or 420.

The material of the elastic insulating layer 600 include polymer. The material of the elastic insulating layer 600 may be a non-conductive polymer such as polyurethane, polyimide, epoxy, polyethylene, or polypropylene. The elastic insulating layer 600 can prevent a short circuit between the elements of the bio-implantable device 100A. In addition, the elastic insulating layer 600 also has good biocompatibility to be able to make direct contact with the creature's body.

The bio-implantable device 100A may establish connections with an external device through the sensor 310, the electrode structure 320, the transceiver 330, and the processor 340. For example, the electrode structure 320 is configured to collect the electric signals from the creature. The sensor 310 receives the electric signals from the electrode structure 320 and converts them into digital signals. The processor 340 receives the digital signals from the sensor 310, and analyzes them, and transmits the analysis results to the radio frequency element 331. The radio frequency element 331 converts the analysis results into high-frequency electrical signals, and transmits them to the antenna 332. The antenna 332 converts the high-frequency electrical signals into electromagnetic waves to radiate them to the external device. The external device, such as a computer, may have an antenna that can receive or emit electromagnetic waves. In this way, the external device can exchange signals with the bio-implantable device 100A, thereby creating a link between the external device and the creature's body.

In addition, the bio-implantable device 100A may further include multiple electronic components 350 due to expansion capabilities. The electronic components 350 may be logic chips. In the example of FIG. 1, the electronic components 350 are disposed on the wiring layer 211, which is exposed by the covering layer 241, and the electronic components 350 are covered by the elastic insulating layer 600. In other embodiments, the electronic components 350 may be embedded in the flexible circuit board 200 without being exposed by the covering layers 241 and 242.

By the above, in the bio-implantable device 100A, the electrode structure 320 can be directly connected to the sensor 310 through the elastic conductive layer 410, thereby shortening a signal transmission path to improve signal integrity, and reducing the thickness and volume of the bio-implantable device 100A, and reducing discomfort to an implanted person. In addition, the elastic conductive layers 410, 420, or the elastic insulating layer 600 covering the flexible circuit board 200, the sensor 310, the radio frequency element 331, or the electronic components 350, due to having elasticity and good biocompatibility, enhance the safety and comfort of the creature in use and also prevent the flexible circuit board 200, the sensor 310, the radio frequency element 331, or the electronic components 350 from external interference.

It is noted that in the example of FIG. 1, the antenna 332 is exposed by the elastic insulating layer 600 and the flexible circuit board 200 to achieve good effect of receiving and transmitting signals, but is not limited thereto. In other embodiments, the antenna 332 and/or the radio frequency element 331 may be embedded in the flexible circuit board 200 without being exposed by the elastic insulating layer 600 or the covering layer 241 or 242. In addition, the flexible circuit board 200 may also include only two wiring layers, such as the wiring layers 211 and 212, and the processor 340 is disposed between the wiring layers 211 and 212, which can also reduce the thickness and volume of the bio-implantable device 100A.

Figure 2:
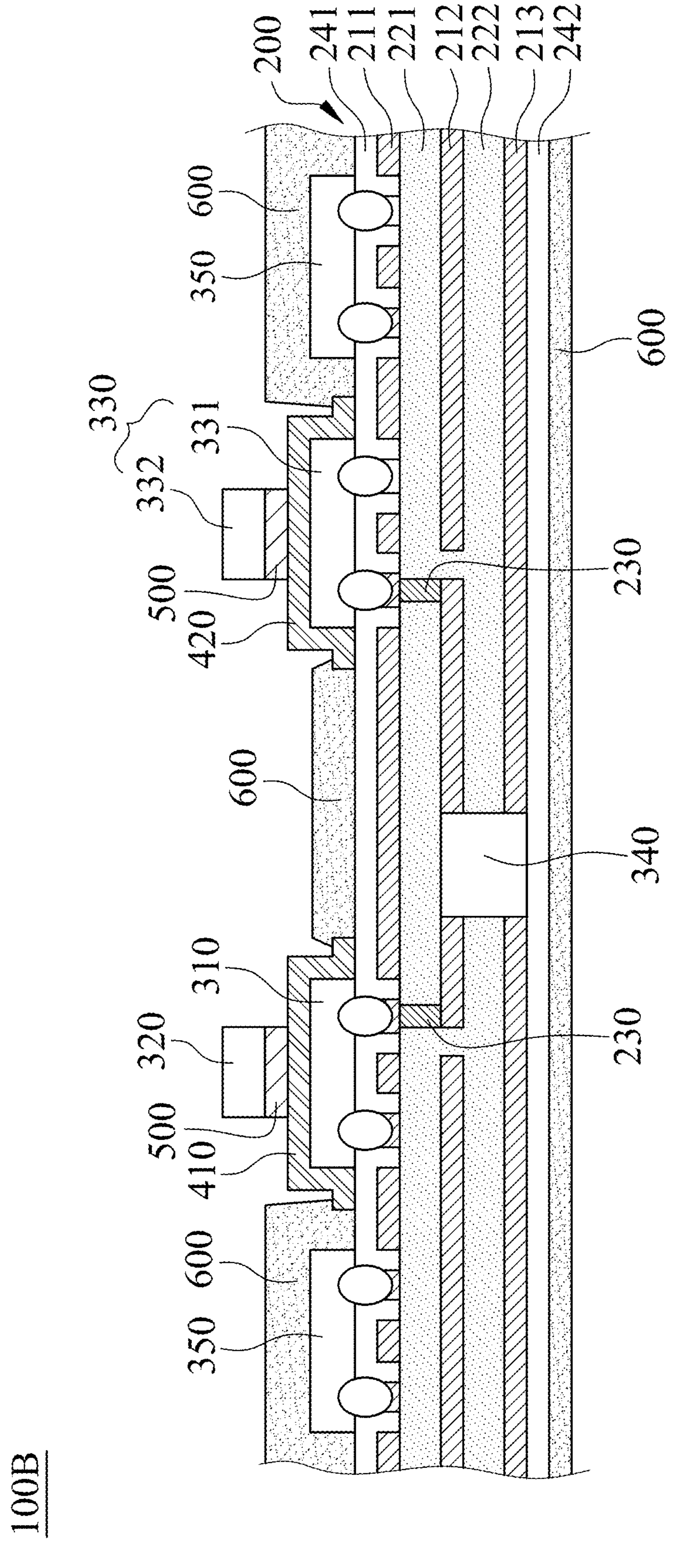
FIG. 2 is a partial cross-sectional diagram of a bio-implantable device according to another embodiment of the application.

FIG. 2 is a partial cross-sectional diagram of a bio-implantable device 100B according to another embodiment of the application. Referring to FIG. 2, the bio-implantable device 100B is similar to the bio-implantable device 100A in FIG. 1, and the differences between the bio-implantable device 100B and 100A are that the thickness of the elastic insulating layer 600 is greater than that of the elastic conductive layer 410 or 420, and the elastic insulating layer 600 covers the edge of the elastic conductive layer 410 or 420 at the junction of the elastic insulating layer 600 and the elastic conductive layer 410 or 420. The bio-implantable device 100B can prevent a gap from existing at the junction of the elastic insulating layer 600 and the elastic conductive layer 410 or 420, that is, the elastic insulating layer 600 covers the flexible circuit board 200 more completely.

Figure 3A:
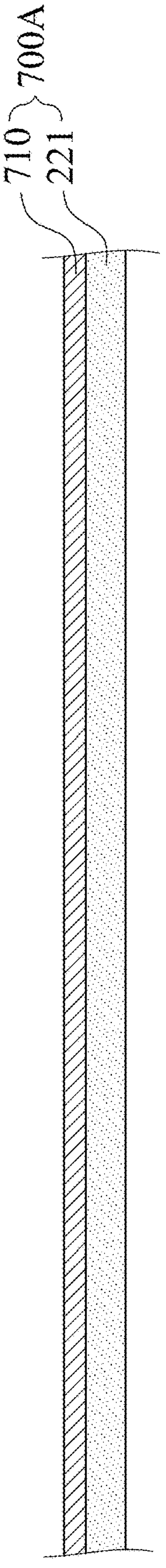
FIG. 3A is a partial cross-sectional schematic diagram of a step of providing a flexible baseboard of a fabricating method of the bio-implantable device of FIG. 1.

A fabricating method of the bio-implantable device 100A of FIG. 1 is then described as follows. FIG. 3A is a partial cross-sectional schematic diagram of a step of providing a flexible baseboard 700A of the fabricating method of the bio-implantable device 100A of FIG. 1. Referring to FIG. 3A, the flexible baseboard 700A is provided, where the flexible baseboard 700A includes a metal layer 710 and a dielectric layer 221. The metal layer 710 is disposed on the dielectric layer 221. The flexible baseboard 700A may be a single layer board. The metal layer 710 may be a copper layer.

Figure 3B:
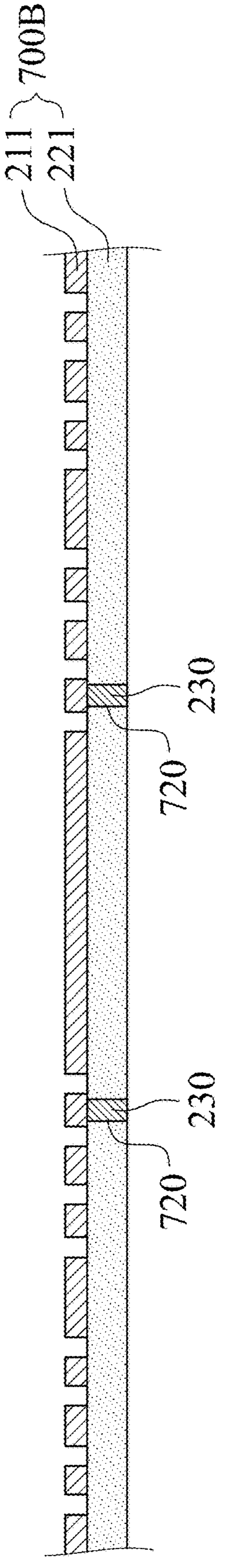
FIG. 3B is a partial cross-sectional schematic diagram of a step of forming a wiring layer and conductive structures of the fabricating method of the bio-implantable device of FIG. 1.

FIG. 3B is a partial cross-sectional schematic diagram of a step of forming the wiring layer 211 and the conductive structures 230 of the fabricating method of the bio-implantable device 100A of FIG. 1. Referring to FIG. 3B, the metal layer 710 is patterned to form the wiring layer 211. For example, the metal layer 710 is formed by etching. In addition, multiple via holes 720 are formed on the dielectric layer 221, and the via holes 720 expose the wiring layer 211. In other words, the via holes 720 do not penetrate the wiring layer 211. The via holes 720 can be formed by a laser drilling process or a mechanical drilling process. The conductive structures 230 are then formed in the via holes 720 to form a flexible baseboard 700B, where the conductive structures 230 are electrically connected to the wiring layer 211. The conductive structures 230 can be formed by electroplating.

Figure 4A:
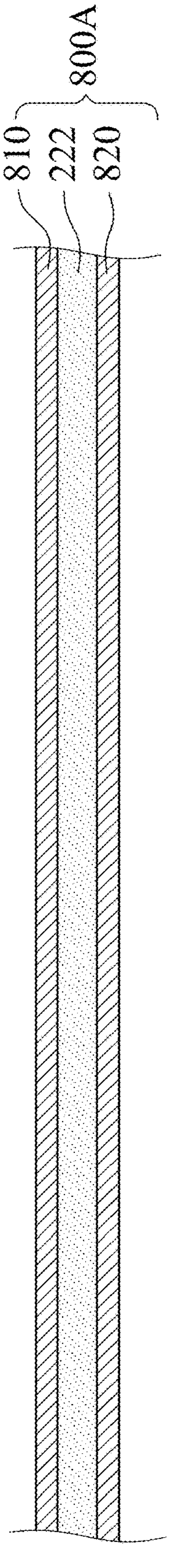
FIG. 4A is a partial cross-sectional schematic diagram of a step of providing another flexible baseboard of the fabricating method of the bio-implantable device of FIG. 1.

FIG. 4A is a partial cross-sectional schematic diagram of a step of providing a flexible baseboard 800A of the fabricating method of the bio-implantable device 100A of FIG. 1. Referring to FIG. 4A, the flexible baseboard 800A is provided, where the flexible baseboard 800A includes metal layers 810, 820 and the dielectric layer 222. The dielectric layer 222 is sandwiched between the metal layers 810 and 820. The flexible baseboard 800A may be a double layer board. The metal layers 810 and 820 are copper layers.

Figure 4B:
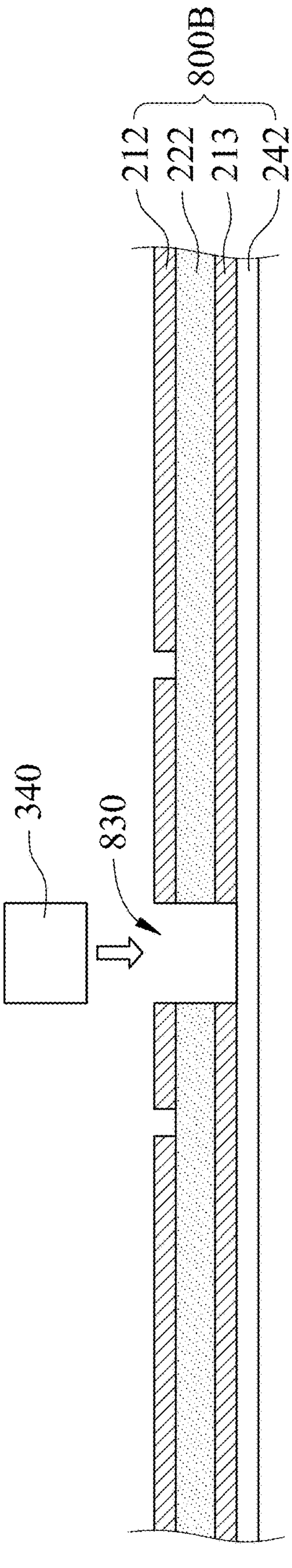
FIG. 4B is a partial cross-sectional schematic diagram of a step of forming another wiring layers, and a covering layer, and disposing a processor of the fabricating method of the bio-implantable device of FIG. 1.

FIG. 4B is a partial cross-sectional schematic diagram of a step of forming the wiring layers 212, 213, and the covering layer 242, and disposing the processor 340 of the fabricating method of the bio-implantable device 100A of FIG. 1. Referring to FIGS. 4A and 4B, the covering layer 242 is first laminated to the metal layer 820. The covering layer 242 can be laminated to the metal layer 820 by a thermal bonding process. A groove 830 is then formed on the metal layers 810, 820, and the dielectric layers 222, and the metal layer 810 is patterned, and the flexible baseboard 800A becomes a flexible baseboard 800B. It is noted that if the metal layer 820 is to be patterned, it should be patterned prior to laminating the covering layer 242.

In the flexible baseboard 800B, the dielectric layer 222 is sandwiched between the wiring layers 212 and 213. The groove 830 extends from the wiring layer 212, through the dielectric layer 222, and to the wiring layer 213 to expose the covering layer 242. In other words, the groove 830 does not penetrate the covering layer 242. The metal layer 810 can be patterned by etching. The groove 830 can be formed by laser cutting. The processor 340 is then disposed in the groove 830.

Figure 5:
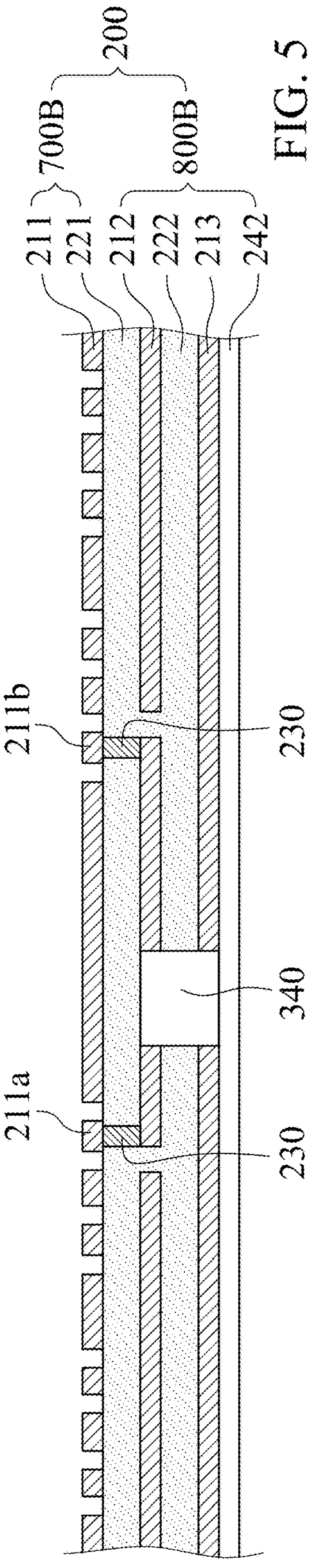
FIG. 5 is a partial cross-sectional schematic diagram of a step of combining the flexible baseboards of the fabricating method of the bio-implantable device of FIG. 1.

FIG. 5 is a partial cross-sectional schematic diagram of a step of combining the flexible baseboards 700B and 800B of the fabricating method of the bio-implantable device 100A of FIG. 1. Referring to FIG. 5, the flexible baseboard 700B and the flexible baseboard 800B are combined to form the flexible circuit board 200. The flexible baseboard 700B covers the processor 340 so that the processor 340 is located inside the flexible circuit board 200 and is not exposed. The flexible baseboard 700B and the flexible baseboard 800B are combined by thermal bonding. The processor 340 is aimed at positions connected to the conductive structures 230, such that the processor 340 is connected to a sensor pad 211*a* and a radio frequency element pad 211*b* of the wiring layer 211 through the conductive structures 230.

Figure 6:
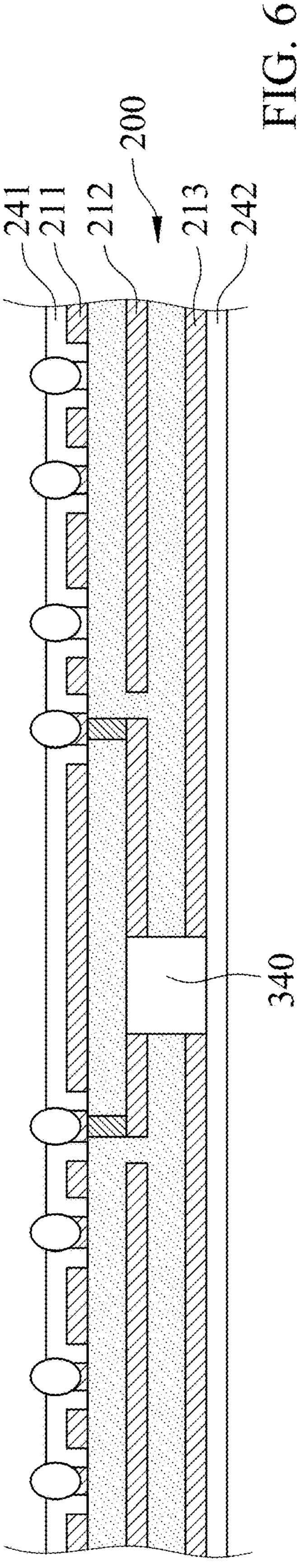
FIG. 6 is a partial cross-sectional schematic diagram of a step of forming another covering layer of the fabricating method of the bio-implantable device of FIG. 1.

FIG. 6 is a partial cross-sectional schematic diagram of a step of forming the covering layer 241 of the fabricating method of the bio-implantable device 100A of FIG. 1. Referring to FIG. 6, the covering layer 241 is laminated to the wiring layer 211. The covering layer 241 may also be laminated to the wiring layer 211 by the thermal bonding process. Solders are then disposed on the wiring layer 211 exposed by the covering layer 241. For example, tin pastes are disposed on the wiring layer 211 using a printing process.

Figure 7:
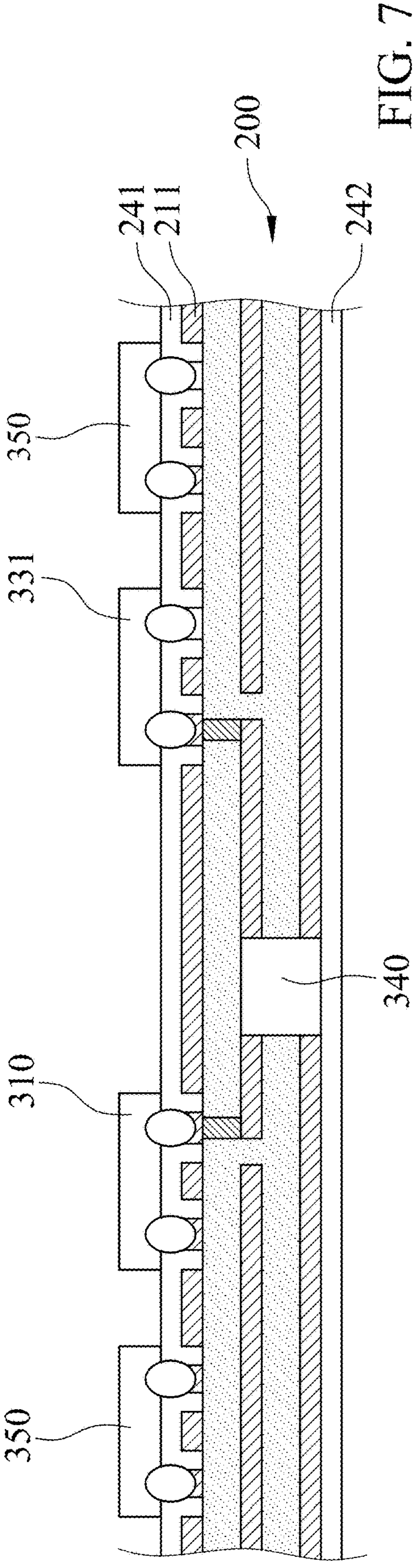
FIG. 7 is a partial cross-sectional schematic diagram of a step of disposing elements of the fabricating method of the bio-implantable device of FIG. 1.

FIG. 7 is a partial cross-sectional schematic diagram of a step of disposing elements of the fabricating method of the bio-implantable device 100A of FIG. 1. Referring to FIG. 7, the sensor 310, the radio frequency element 331, and the electronic components 350 are disposed on the wiring layer 211 exposed by the covering layer 241. The sensor 310, the radio frequency element 331, and the electronic components 350 are electrically connected to the wiring layer 211 by a soldering process.

Figure 8:
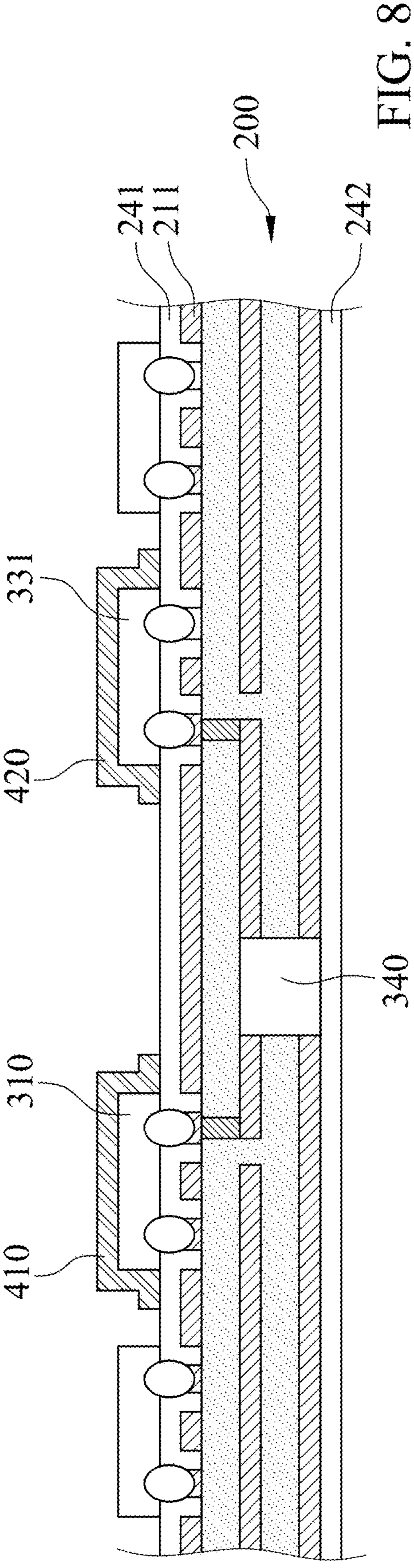
FIG. 8 is a partial cross-sectional schematic diagram of a step of forming elastic conductive layers of the fabricating method of the bio-implantable device of FIG. 1.

FIG. 8 is a partial cross-sectional schematic diagram of a step of forming the elastic conductive layers 410 and 420 of the fabricating method of the bio-implantable device 100A of FIG. 1. Referring to FIG. 8, the elastic conductive layers 410 and 420 are respectively formed on the sensor 310 and the radio frequency element 331. The elastic conductive layers 410 and 420 cover the sensor 310 and the radio frequency element 331 by a coating process or a thermal bonding process, so that the elastic conductive layers 410 and 420 cover the sensor 310 and the radio frequency element 331 exposed by the covering layer 241.

Figure 9:
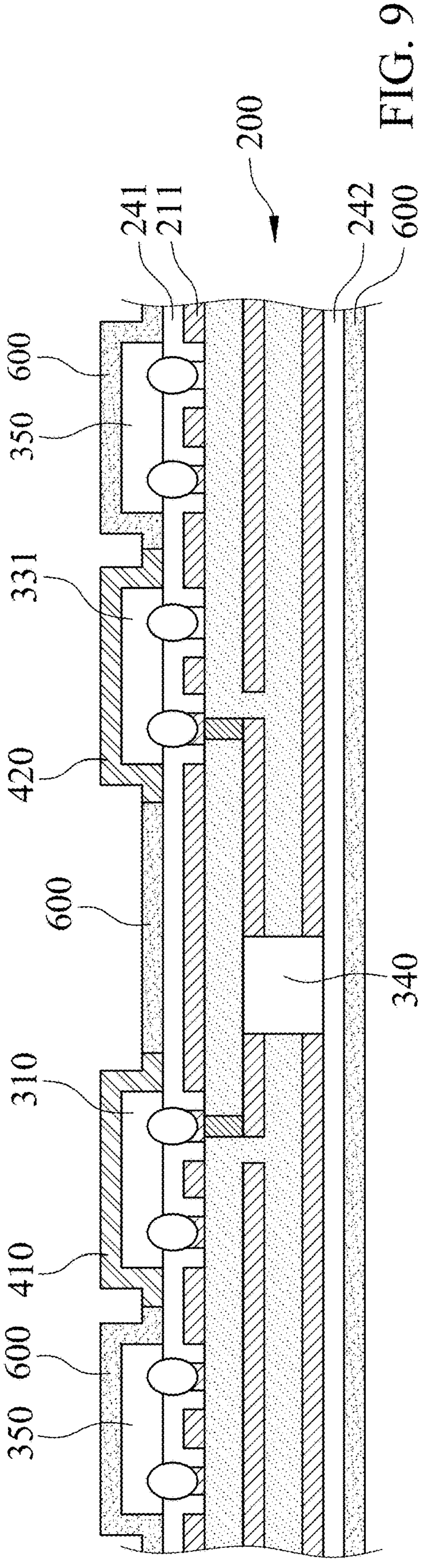
FIG. 9 is a partial cross-sectional schematic diagram of a step of forming a elastic insulating layer of the fabricating method of the bio-implantable device of FIG. 1.

FIG. 9 is a partial cross-sectional schematic diagram of a step of forming the elastic insulating layer 600 of the fabricating method of the bio-implantable device 100A of FIG. 1. Referring to FIG. 9, the elastic insulating layer 600 is formed on the flexible circuit board 200. Similar to the formations of the elastic conductive layers 410 and 420, the elastic insulating layer 600 is also formed by the coating process or the thermal bonding process to cover the flexible circuit board 200 and to expose the elastic conductive layers 410 and 420. It is noted that when the elastic insulating layer 600 of FIG. 1 is formed, the thickness of the elastic insulating layer 600 over the covering layer 241 is similar to that of the elastic conductive layer 410 or 420, and the surface of the elastic insulating layer 600 is flush with that of the elastic conductive layer 410 or 420 at the junction of the elastic insulating layer 600 and the elastic conductive layer 410 or 420. The edges of the elastic insulating layer 600 and the elastic conductive layer 410 or 420 may be close together at the junction.

Figure 10:
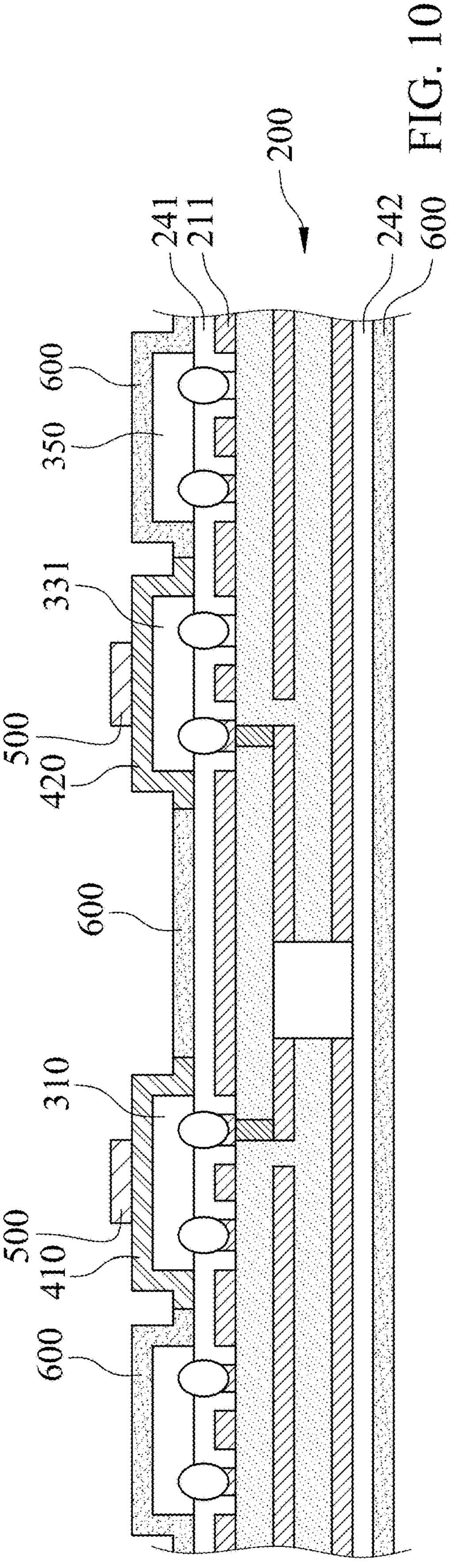
FIG. 10 is a partial cross-sectional schematic diagram of a step of forming a conductive adhesive layer of the fabricating method of the bio-implantable device of FIG. 1.

FIG. 10 is a partial cross-sectional schematic diagram of a step of forming the conductive adhesive layers 500 of the fabricating method of the bio-implantable device 100A of FIG. 1. Referring to FIG. 10, the conductive adhesive layers 500 are formed on the elastic conductive layers 410 and 420. The conductive adhesive layers 500 can be formed by a coating process. The electrode structure 320 is then disposed on the elastic conductive layer 410, and the electrode structure 320 is bonded and electrically conductive to the elastic conductive layer 410 through the conductive adhesive layer 500. The antenna 332 is disposed on the elastic conductive layer 420, and the antenna 332 is bonded and electrically conductive to the elastic conductive layer 420 through the conductive adhesive layer 500. Thus, the fabrication of the bio-implantable device 100A is substantially complete.

It is noted that a fabricating method of the bio-implantable device 100B of FIG. 2 is similar to that of the bio-implantable device 100A of FIG. 1, and the differences between the fabricating methods of the bio-implantable devices 100A and 100B are that when the elastic insulating layer 600 (FIG. 9) of FIG. 2 is formed, the thickness of the elastic insulating layer 600 on the covering layer 241 is greater than that of the elastic conductive layer 410 or 420, and the elastic insulating layer 600 covers the edges of the elastic conductive layers 410 and 420. It is worth mentioning that in steps of the fabricating methods of the bio-implantable devices 100A and 100B, the steps of forming the elastic insulating layer 600 are to be performed after the steps of forming the elastic conductive layers 410 and 420 to prevent the elastic conductive layers 410 and 420 from forming on the elastic insulating layer 600 to cause short circuits.

Consequently, in the bio-implantable devices 100A and 100B disclosed by the above embodiments, the electrode structures 320 are directly electrically connected to the sensors 310 through the elastic conductive layers 410, thereby shortening the signal transmission paths, and improving signal integrity, and reducing the thicknesses and volumes of the bio-implantable devices 100A and 100B, and reducing discomfort to implanted subjects. In addition, since the elastic conductive layers 410 or 420 or the elastic insulating layers 600 covering the flexible circuit boards 200, the sensors 310, the radio frequency elements 331, and the electronic components 350 have elasticity and good biocompatibility, the safety and comfort of the creature in use are enhanced, and the elastic conductive layers 410 or 420 or the elastic insulating layers 600 also protect the flexible circuit boards 200, the sensors 310, the radio frequency elements 331, and the electronic components 350 from external interference.

In addition, in the bio-implantable device 100B, the elastic insulating layer 600 also covers the edges of the elastic conductive layers 410 and 420, thereby preventing the gap from existing at the junction of the elastic insulating layer 600 and the elastic conductive layer 410 or 420. The elastic insulating layer 600 covers the flexible circuit board 200 more completely.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A bio-implantable device, comprising:
- a flexible circuit board comprising a wiring layer;
- a sensor disposed on the wiring layer;
- a first elastic conductive layer covering the sensor;
- an electrode structure disposed on the first elastic conductive layer and configured to collect an electric signal from a creature, wherein the electrode structure is electrically connected to the sensor through the first elastic conductive layer; and
- an elastic insulating layer covering the flexible circuit board and exposing the electrode structure and the first elastic conductive layer.

2. The bio-implantable device of claim 1, further comprising:
- a processor disposed inside the flexible circuit board and electrically connected to the sensor.

3. The bio-implantable device of claim 2, further comprising:
- a transceiver disposed on the flexible circuit board and electrically connected to the processor.

4. The bio-implantable device of claim 3, further comprising:
- a second elastic conductive layer, and
- wherein the transceiver comprises:
  - a radio frequency element disposed on the wiring layer, wherein the second elastic conductive layer covers the radio frequency element; and
  - an antenna disposed on the second elastic conductive layer, wherein the antenna is electrically connected to the radio frequency element through the second elastic conductive layer.

5. The bio-implantable device of claim 4, wherein the elastic insulating layer exposes the transceiver and the second elastic conductive layer.

6. The bio-implantable device of claim 5, wherein a thickness of the elastic insulating layer is identical to a thickness of the second elastic conductive layer, and a surface of the elastic insulating layer is flush with a surface of the second elastic conductive layer at a junction of the elastic insulating layer and the second elastic conductive layer.

7. The bio-implantable device of claim 5, wherein a thickness of the elastic insulating layer is greater than a thickness of the second elastic conductive layer, and the elastic insulating layer covers an edge of the second elastic conductive layer at a junction of the elastic insulating layer and the second elastic conductive layer.

8. The bio-implantable device of claim 1, wherein a material of the first elastic conductive layer comprises an electroactive polymer.

9. The bio-implantable device of claim 1, wherein a material of the elastic insulating layer comprises a polymer.

10. The bio-implantable device of claim 1, further comprising:
- a conductive adhesive layer disposed between the electrode structure and the first elastic conductive layer, wherein the electrode structure and the first elastic conductive layer are bonded and electrically conductive.

11. The bio-implantable device of claim 1, wherein a thickness of the elastic insulating layer is identical to a thickness of the first elastic conductive layer, and a surface of the elastic insulating layer is flush with a surface of the first elastic conductive layer at a junction of the elastic insulating layer and the first elastic conductive layer.

12. The bio-implantable device of claim 1, wherein a thickness of the elastic insulating layer is greater than a thickness of the first elastic conductive layer, and the elastic insulating layer covers an edge of the first elastic conductive layer at a junction of the elastic insulating layer and the first elastic conductive layer.

13. A fabricating method of a bio-implantable device, comprising:
- providing a flexible circuit board, wherein the flexible circuit board comprises a wiring layer;
- disposing a sensor on the wiring layer;
- forming a first elastic conductive layer to cover the sensor after disposing the sensor;
- forming an elastic insulating layer to cover the flexible circuit board and to expose the first elastic conductive layer after forming the first elastic conductive layer; and
- disposing an electrode structure on the first elastic conductive layer after forming the first elastic conductive layer, wherein the electrode structure is electrically connected to the sensor through the first elastic conductive layer.

14. The fabricating method of the bio-implantable device of claim 13, wherein a step of providing the flexible circuit board comprises:
- providing a first flexible baseboard, wherein the first flexible baseboard comprises a metal layer;
- patterning the metal layer to form the wiring layer;
- providing a second flexible baseboard;

forming a groove on the second flexible baseboard;
disposing a processor in the groove; and
combining the first flexible baseboard and the second flexible baseboard to form the flexible circuit board after disposing the processor and forming the wiring layer, wherein the first flexible baseboard covers the processor and the processor is located in the flexible circuit board.

15. The fabricating method of the bio-implantable device of claim 13, further comprising:
disposing a radio frequency element on the wiring layer before forming the elastic insulating layer;
forming a second elastic conductive layer on the radio frequency element after disposing the radio frequency element and before forming the elastic insulating layer, wherein the second elastic conductive layer covers the radio frequency element; and
disposing an antenna on the second elastic conductive layer, wherein the antenna is electrically connected to the radio frequency element through the second elastic conductive layer, and the elastic insulating layer exposes the second elastic conductive layer and the antenna.

16. The fabricating method of the bio-implantable device of claim 13, further comprising:
forming a conductive adhesive layer on the first elastic conductive layer before disposing the electrode structure on the first elastic conductive layer, wherein the conductive adhesive layer is bonded to the first elastic conductive layer and the electrode structure, and is electrically conductive to the first elastic conductive layer and the electrode structure.

* * * * *